United States Patent
Trivedi

(10) Patent No.: US 8,193,868 B2
(45) Date of Patent: Jun. 5, 2012

(54) SWITCHED CAPACITOR CIRCUIT FOR A VOLTAGE CONTROLLED OSCILLATOR

(75) Inventor: Vishal P. Trivedi, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 21 days.

(21) Appl. No.: 12/769,046

(22) Filed: Apr. 28, 2010

(65) Prior Publication Data

US 2011/0267149 A1    Nov. 3, 2011

(51) Int. Cl.
 *H03B 5/12* (2006.01)
 *H03C 3/22* (2006.01)
 *H01P 1/15* (2006.01)
(52) U.S. Cl. ............... 331/117 R; 331/117 V; 331/185; 333/103; 333/262
(58) Field of Classification Search ............... 331/36 C, 331/117 FE, 117 R, 167, 177 V, 185; 333/103, 333/262
See application file for complete search history.

(56) References Cited

U.S. PATENT DOCUMENTS

| | | | |
|---|---|---|---|
| 3,889,210 A * | 6/1975 | Matsuura et al. | 331/109 |
| 4,786,903 A * | 11/1988 | Grindahl et al. | 340/10.4 |
| 6,114,923 A | 9/2000 | Mizutani | |
| 6,281,758 B1 * | 8/2001 | Elsayed et al. | 331/16 |
| 6,288,620 B1 * | 9/2001 | Atokawa et al. | 333/103 |
| 6,292,063 B1 * | 9/2001 | Tanemura et al. | 331/49 |
| 6,927,643 B2 * | 8/2005 | Lazarescu et al. | 331/186 |
| 7,538,643 B2 | 5/2009 | Mizutani | |
| 7,889,023 B2 * | 2/2011 | Mun et al. | 333/101 |

FOREIGN PATENT DOCUMENTS

JP    11-074703 A    3/1999

* cited by examiner

*Primary Examiner* — Levi Gannon
(74) *Attorney, Agent, or Firm* — Ranjeev Singh; Jonathan N. Geld

(57) ABSTRACT

A switched capacitor circuit for use at at least one operating frequency is provided. The switched capacitor may include an inductive element having a first terminal coupled to a switching voltage and a second terminal. The switched capacitor circuit may further include a hetero-junction bipolar transistor (HBT) having a base terminal coupled to the second terminal of the inductive element, a first conducting terminal, and a second conducting terminal coupled to a voltage supply terminal. The switched capacitor circuit may further include a capacitor having a first terminal coupled to the first conducting terminal of the HBT and a second terminal coupled to a node, wherein a capacitance value at the node is a function of the switching voltage, and wherein the inductive element is configured such that a combined impedance of an impedance of the capacitor, an impedance of the HBT, and an impedance of inductive element resonates at the at least one operating frequency only when the HBT is substantially non-conducting.

13 Claims, 3 Drawing Sheets

SWITCHED CAPACITOR CIRCUIT FOR A VOLTAGE CONTROLLED OSCILLATOR

BACKGROUND

1. Field

This disclosure relates generally to switched capacitor circuits, and more specifically, to switched capacitor circuits for a voltage controlled oscillator.

2. Related Art

Voltage controlled oscillators (VCOs) are increasingly required to provide a wide range of frequencies. Such VCOs are also required to operate with a high degree of accuracy despite process, voltage, and temperature variations. These constraints can be difficult to satisfy in VCOs that are used at extremely high frequencies (e.g., in the range of frequencies from 30 to 300 gigahertz). This high range of frequencies corresponds to a wavelength of one to ten millimeters, which is also referred to as the millimeter wave (mmW) band. Conventional varactors used in the VCOs have limitations related to one's ability to change the capacitance to realize a wider range of frequency and to address process, voltage, and temperature variations.

Accordingly, there is a need for switched capacitor circuits for a voltage controlled oscillator.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
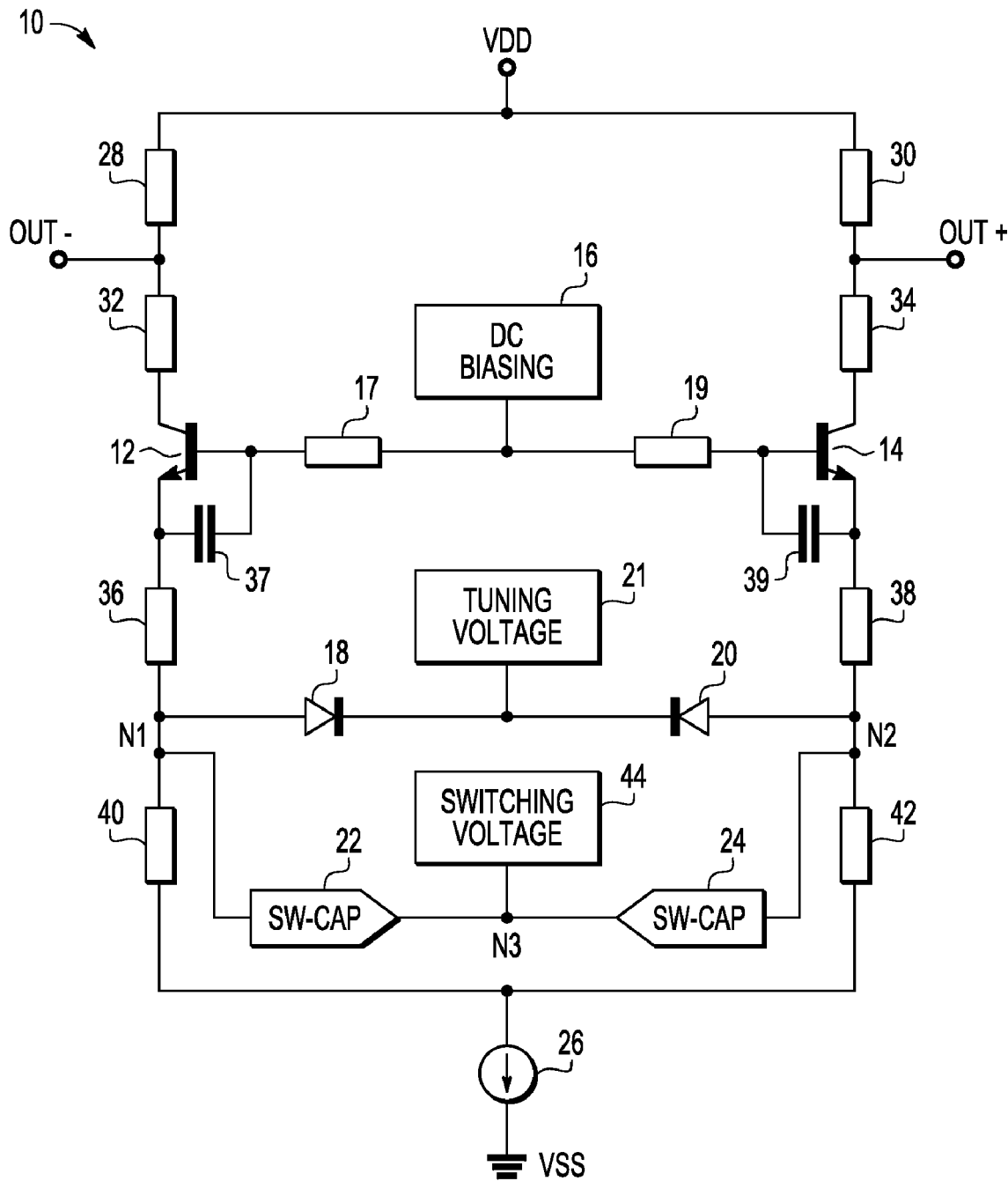
FIG. 1 is a schematic diagram of an exemplary differential voltage controlled oscillator (VCO) with switched capacitor circuits.

In one aspect, a switched capacitor circuit for use at at least one operating frequency is provided. The switched capacitor may include an inductive element having a first terminal and a second terminal, wherein the first terminal is coupled to receive a switching voltage. The switched capacitor circuit may further include a hetero-junction bipolar transistor (HBT) having a base terminal, a first conducting terminal, and a second conducting terminal, wherein the base terminal of the HBT is coupled to the second terminal of the inductive element, and wherein the second conducting terminal of the HBT is coupled to a voltage supply terminal. The switched capacitor circuit may further include a capacitor having a first terminal and a second terminal, wherein the first terminal of the capacitor is coupled to the first conducting terminal of the HBT and the second terminal of the capacitor is coupled to a node, wherein a capacitance value at the node is a function of the switching voltage, and wherein the inductive element is configured such that a combined impedance of an impedance of the capacitor, an impedance of the HBT, and an impedance of inductive element resonates at the at least one operating frequency only when the HBT is substantially non-conducting.

In another aspect, a switched capacitor circuit for use at at least one operating frequency is provided. The switched capacitor may include an inductive element having a first terminal and a second terminal, wherein the first terminal is coupled to receive a switching voltage. The switched capacitor circuit may further include a diode having an anode terminal and a cathode terminal, wherein the anode terminal of the diode is coupled to the second terminal of the inductive element and wherein the cathode terminal of the diode is coupled to a voltage supply terminal. The switched capacitor circuit may further include a capacitor having a first terminal and a second terminal, wherein the first terminal of the capacitor is coupled to the anode terminal of the diode and the second terminal of the capacitor is coupled to a node, wherein the capacitance value at the node is a function of the switching voltage, and wherein the inductive element is configured such that a combined impedance of an impedance of the capacitor, an impedance of the diode, and an impedance of inductive element resonates at the at least one operating frequency only when the diode is substantially non-conducting.

In yet another aspect, a differential voltage controlled oscillator (VCO) for use at at least one operating frequency is provided. The differential VCO may include a first switched capacitor circuit and a second switched capacitor circuit. The first switched capacitor circuit may include a first inductive element having a first terminal and a second terminal, wherein the first terminal is coupled to receive a switching voltage. The first switched capacitor circuit may further include a first hetero-junction bipolar transistor (HBT) having a base terminal, a first conducting terminal, and a second conducting terminal, wherein the base terminal of the first HBT is coupled to the second terminal of the first inductive element, and wherein the second conducting terminal of the first HBT is coupled to a voltage supply terminal. The first switched capacitor circuit may further include a first capacitor having a first terminal and a second terminal, wherein the first terminal of the first capacitor is coupled to the first conducting terminal of the first HBT and the second terminal of the first capacitor is coupled to a first node, wherein a capacitance value at the first node is a function of the switching voltage, and wherein the first inductive element is configured such that a combined impedance of an impedance of the first capacitor, an impedance of the first HBT, and an impedance of the first inductive element resonates at the at least one operating frequency only when the first HBT is substantially non-conducting. In addition, the first node is coupled to a first variable capacitor such that the first variable capacitor is in parallel to the first capacitor. The second switched capacitor circuit may include a second inductive element having a first terminal and a second terminal, wherein the first terminal is coupled to receive the switching voltage. The second switched capacitor circuit may further include a second hetero-junction bipolar transistor (HBT) having a base terminal, a first conducting terminal, and a second conducting terminal, wherein the base terminal of the second HBT is coupled to the second terminal of the second inductive element, and wherein the second conducting terminal of the second HBT is coupled to the voltage supply terminal. The second switched capacitor circuit may further include a second capacitor having a first terminal and a second terminal, wherein the first terminal of the second capacitor is coupled to the first conducting terminal of the second HBT and the second terminal of the second capacitor is coupled to a second node, and wherein the second inductive element is configured such that a combined impedance of an impedance of the second capacitor, an impedance of the second HBT, and an impedance of the second inductive element resonates at the at least one operating frequency only when the second HBT is substantially non-conducting.

FIG. 1 is a schematic diagram of an exemplary differential voltage controlled oscillator (VCO) 10 with switched capacitor circuits 22 and 24. In one embodiment, differential VCO 10 may be configured as a Colpitts VCO. Differential VCO 10 may include transistors 12 and 14. Differential VCO 10 may further include a DC biasing source 16 that may be used to provide a DC bias to transistors 12 and 14. By way of example, the base terminal of transistor 12 may be coupled to DC biasing source 16 via a transmission line 17. Similarly, the base terminal of transistor 14 may be coupled to DC biasing source 16 via a transmission line 19. Transmission lines 17 and 19 form the main inductive elements of the LC tank of the oscillator. The collector terminal of transistor 12 may be coupled to an output terminal (labeled OUT−) via a transmission line 32. The collector terminal of transistor 14 may be coupled to an output terminal (labeled OUT+) via a transmission line 34. The output terminal, labeled as OUT−, may be coupled to a voltage supply VDD via a transmission line 28. The output terminal, labeled as OUT+, may be coupled to the voltage supply VDD via a transmission line 30. A capacitor 37 may be coupled between the base terminal and the emitter terminal of transistor 12. Another capacitor 39 may be coupled between the base terminal and the emitter terminal of transistor 14.

With continued reference to FIG. 1, the emitter terminal of transistor 12 may be coupled to node N1 via a transmission line 36. The emitter terminal of transistor 14 may be coupled to node N2 via a transmission line 38. Differential VCO 10 may further include varactor diodes 18 and 20, which may be tuned using tuning voltage received from a tuning voltage source 21. One terminal of varactor diode 18 may be coupled to node N1 and the other terminal may be coupled to varactor diode 20 and may further be coupled to tuning voltage source 21. One terminal of varactor diode 20 may be coupled to node N2 and the other terminal may be coupled to varactor diode 18 and to tuning voltage source 21. Differential VCO 10 may further include switched capacitor circuits 22 and 24. Differential VCO 10 may further include a switching voltage source 44. Switched capacitor circuit 22 may be coupled between node N1 and node N3. Switched capacitor circuit 24 may be coupled between node N2 and node N3. Node N3 may be coupled to switching voltage source 44, such that each of the switching capacitor circuits may receive a switching voltage. Node N1 may be coupled to a voltage supply terminal VSS via a transmission line 40 and a bias current source 26. Node N2 may be coupled to the voltage supply terminal VSS via transmission line 42 and bias current source 26. Although FIG. 1 describes the switched capacitor circuits being used in a differential VCO application, these might be used in other applications, such as tunable phase shifters/rotators. Although FIG. 1 shows a specific number of components arranged in a certain manner, differential VCO 10 may include additional or fewer components arranged differently.

In operation, switched capacitor circuits 22 and 24 may be used for two different applications. In one application, switched capacitor circuits 22 and 24 may be used to vary the capacitance of the LC tank of differential VCO 10 to support two ranges of frequencies (or bands). For example, based on whether the switched capacitor circuits are in one state or another state, differential VCO 10 may operate in two different bands. By way of example, when the switched capacitor circuits are configured to keep a capacitor on then the differential VCO may operate in one band (e.g., 76-77 GHz). However, when the switched capacitor circuits are configured to keep the capacitor off then the differential VCO may operate in another band (e.g., 77-81 GHz). In another application, switched capacitor circuits 22 and 24 may be used to vary the capacitance of the LC tank of differential VCO 10 to adjust for deviations in the frequency of differential VCO 10 as a result of process, voltage, and/or temperature variations. Parallel combination of multiple sets of switches with corresponding voltage sources can also be used for operating in multiple different frequency bands or for making additional adjustments of process, voltage, and/or temperature variations. Discrete switching, for example, using varactors does not fully compensate for such variations. Additional details regarding the operation of the switched capacitor circuits are provided below.

Figure 2:
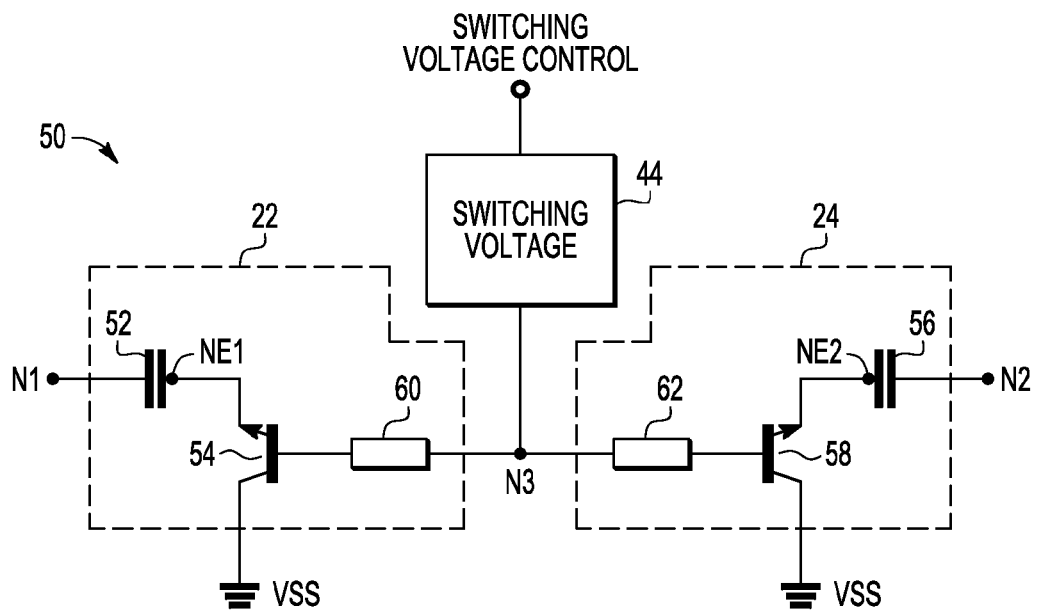
FIG. 2 is a schematic diagram of a portion of the exemplary differential VCO of FIG. 1 with exemplary switched capacitor circuits.

FIG. 2 is a schematic diagram of a portion 50 including exemplary switched capacitor circuits 22 and 24 of FIG. 1. By way of example, switched capacitor circuit 22 may include a capacitor 52, a hetero-junction bipolar transistor (HBT) 54, and an inductive element 60. One terminal of capacitor 52 may be coupled to node N1 (node N1 is shown in FIG. 1). The other terminal of capacitor 52 may be coupled to the emitter terminal of HBT 54 at node NE1. Node NE1 is floating in DC operation. The DC voltage at node NE1 is governed by a steady-state balance at node NE1. The collector terminal of HBT 54 may be coupled to voltage supply terminal VSS. The base terminal of HBT 54 may be coupled to one terminal of inductive element 60. The other terminal of inductive element 60 may be coupled to node N3 (node N3 is shown in FIG. 1) and may receive a voltage from switching voltage source 44. Switching voltage source 44 may provide a switching voltage based on a control signal (e.g., SWITCHING CONTROL SIGNAL). Switching voltage source 44 may include elements, such as de-coupling capacitors to provide an AC ground at node N3. In one embodiment, the application of the switching voltage may determine whether HBT 54 is substantially conducting or substantially non-conducting. When the switching voltage is approximately zero, HBT 54 may be substantially non-conducting. When HBT 54 is substantially non-conducting, then both base-to-emitter and base-to-collector junctions are off. This means that the junction impedance is predominantly capacitive. Inductive element 60 may be implemented using a transmission line. The length and/or width of the transmission line, used to implement inductive element 60, may be selected such that the combined impedance of capacitor 52, junction impedances of HBT 54 and inductive element 60 resonate at a certain frequency when HBT 54 is substantially non-conducting. The resonance results in high impedance equivalent to an open circuit for switched capacitor circuit 22 at node N1, constituting the switched capacitor circuit being off and differential VCO 10 of FIG. 1 operating in a first frequency band (e.g., 77-81 GHz). Because the bandwidth of the noted resonance is finite, the resonance frequency should be a frequency within the first frequency band. When the switching voltage is above the turn-on voltage of the base-to-emitter and base-to-collector junction, the HBT 54 is in substantially conducting mode. This means that the junction impedance is predominantly resistive, and the combined impedance of capacitor 52, junction impedance of HBT 54, and inductive element 60 does not resonate when HBT 54 is in substantially conducting mode. This means that the impedance of the switched capacitor circuit 22 is comparable to that of the capacitor 52, constituting the switched capacitor circuit 22 being on and differential VCO 10 of FIG. 1 operating in a second frequency band (e.g., 76-77 GHz)

With continued reference to FIG. 2, as an example, to facilitate the differential operation of differential VCO of FIG. 1, switched capacitor circuit 24 is implemented as a mirror-image of switched capacitor circuit 22. Switched capacitor circuit 24 may include a capacitor 56, a heterojunction bipolar transistor (HBT) 58, and an inductive element 62. One terminal of capacitor 56 may be coupled to node N1 (node N1 is shown in FIG. 1). The other terminal of capacitor 56 may be coupled to the emitter terminal of HBT 58 at node NE2. Node NE2 is floating in DC operation. The DC voltage at node NE2 is governed by a steady-state balance at node NE2. The collector terminal of HBT 58 may be coupled to voltage supply terminal VSS. The base terminal of HBT 58 may be coupled to one terminal of inductive element 62. The other terminal of inductive element 62 may be coupled to node N3 (node N3 is shown in FIG. 1) and may receive a voltage from switching voltage source 44. In one embodiment, the application of the switching voltage may determine whether HBT 58 is substantially conducting or substantially non-conducting. When the switching voltage is approximately zero, HBT 58 may be substantially non-conducting. When HBT 58 is substantially non-conducting, then both base-to-emitter and base-to-collector junctions are off. This means that the junction impedance is predominantly capacitive. Inductive element 62 may be implemented using a transmission line. The length and/or width of the transmission line used to implement inductive element 62 may be selected such that the combined impedance of capacitor 56, junction impedances of HBT 58, and inductive element 62 resonate at a certain frequency when HBT 58 is non-conducting. In operation, switched capacitor circuit 24 behaves in the same manner as switched capacitor circuit 22. Although FIG. 2 shows a specific number of components arranged in a certain manner, portion 50 may include additional or fewer components arranged differently.

Figure 3:
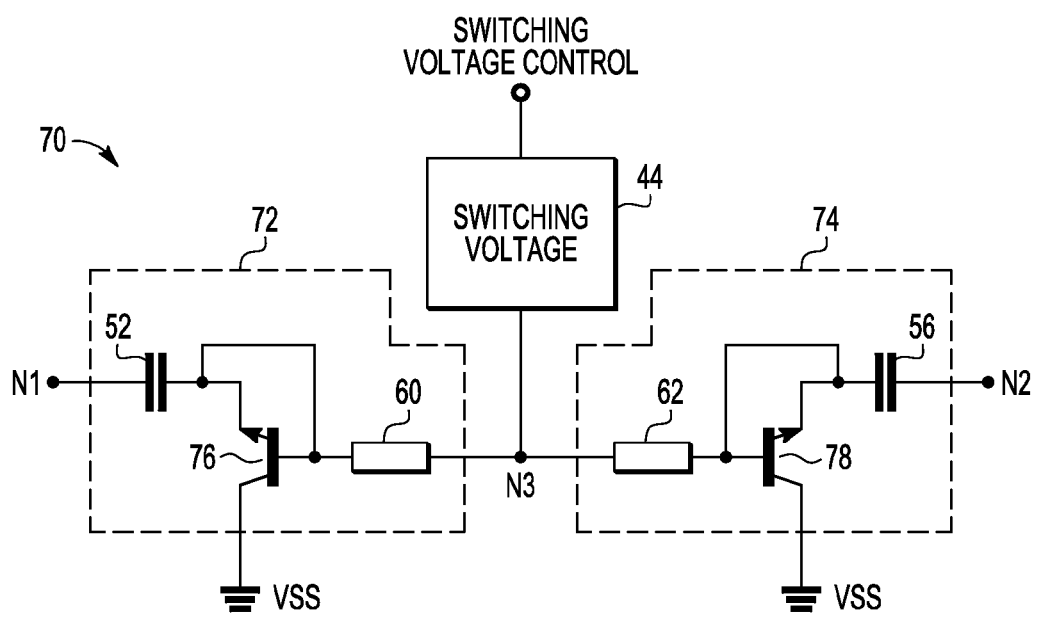
FIG. 3 is a schematic diagram of a portion of the exemplary differential VCO of FIG. 1 with other exemplary switched capacitor circuits.

FIG. 3 is a schematic diagram of a portion 70 (a different implementation of portion 50) with exemplary switched capacitor circuits 72 and 74 (different implementation of switched circuits 22 and 24) of FIG. 1. Switched capacitor circuits 72 and 74 may be used with differential VCO 10 in the same fashion as switched capacitor circuits 22 and 24. The common components are not described, unless their operation is different from switched capacitor circuits 22 and 24. Switched capacitor circuits 72 and 74 are different from switched capacitor circuits 22 and 24 in terms of how the HBTs are configured. By way of example, switched capacitor circuit 72 may include a HBT 76, whose emitter terminal may be coupled to one terminal of capacitor 52. The collector terminal of HBT 76 may be coupled to voltage supply terminal VSS. The base terminal of HBT 76 may be coupled to one terminal of inductive element 60 and further may be coupled to the emitter terminal of HBT 76. Thus, HBT 76 may be configured as a diode-connected transistor. Similarly, by way of example, switched capacitor circuit 74 may include a HBT 78, whose emitter terminal may be coupled to one terminal of capacitor 56. The collector terminal of HBT 78 may be coupled to voltage supply terminal VSS. The base terminal of HBT 78 may be coupled to one terminal of inductive element 62 and further may be coupled to the emitter terminal of HBT 78. Thus, HBT 78 may be configured as a diode-connected transistor.

Figure 4:
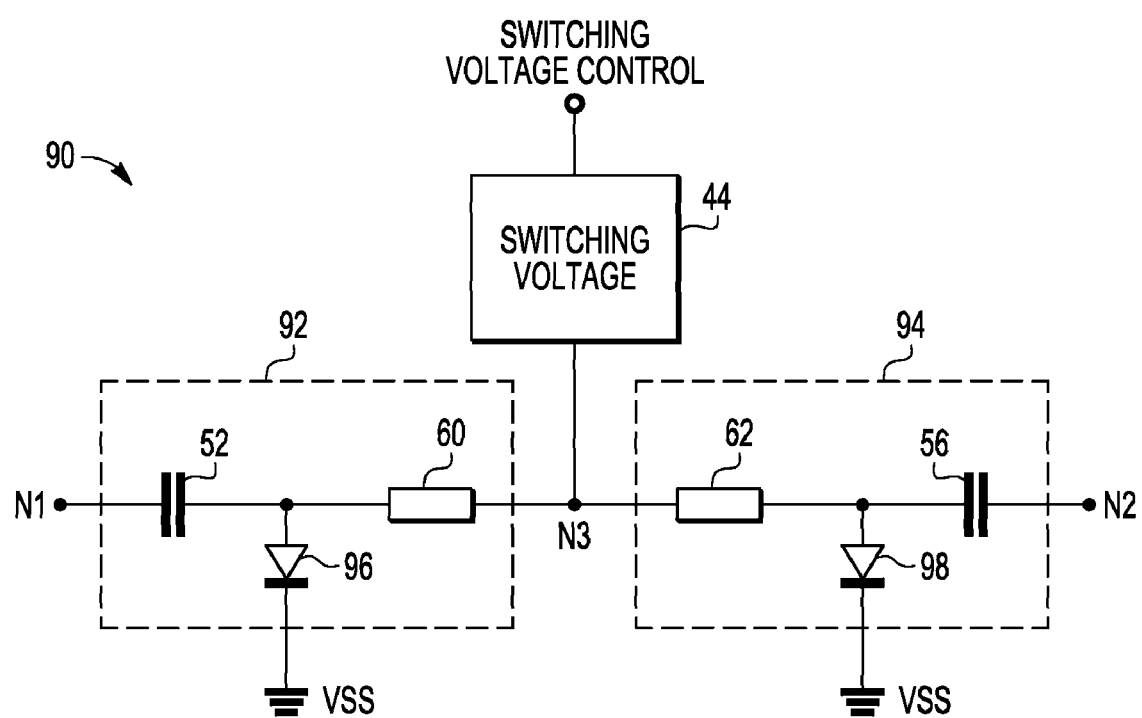
FIG. 4 is a schematic diagram of a portion of the exemplary differential VCO of FIG. 1 with other exemplary switched capacitor circuits.

FIG. 4 is a schematic diagram of a portion 90 (a different implementation of portion 50) with exemplary switched capacitor circuits 92 and 94 (different implementation of switched circuits 22 and 24) of FIG. 1. Switched capacitor circuits 92 and 94 may be used with differential VCO 10 in the same fashion as switched capacitor circuits 22 and 24. The common components are not described, unless their operation is different from switched capacitor circuits 22 and 24. Switched capacitor circuits 92 and 94 are different from switched capacitor circuits 22 and 24 in that instead of HBTs, diodes may be used. By way of example, switched capacitor circuit 92 may include a diode 96. The anode terminal of diode 96 may be coupled to a terminal of capacitor 52. The anode terminal of diode 96 may further be coupled to a terminal of inductive element 60. The cathode terminal of diode 96 may be coupled to voltage supply terminal VSS. In one embodiment, the application of the switching voltage may determine whether diode 96 is substantially conducting or substantially non-conducting. When the switching voltage is approximately zero, diode 96 may be substantially non-conducting. This means that the diode impedance is predominantly capacitive. Inductive element 60 may be implemented using a transmission line. The length and/or width of the transmission line used to implement inductive element 60 may be selected such that the combined impedance of: (1) the impedance of capacitor 52, (2) the impedance of diode 96, and (3) the impedance of inductive element 60 resonate at a certain frequency when diode 96 is substantially non-conducting. When the switching voltage is larger than the turn-on voltage for diode 96, typically 0.8V for Si diodes, diode 96 is substantially conducting. This means that the diode impedance is resistive and the combined impedance of: (1) the impedance of capacitor 52, (2) the impedance of diode 96, and (3) the impedance of inductive element 60 will not resonate. Like the operation of HBT 54 of switched capacitor circuit 22, the conducting and non-conducting states of diode 96 provide two different bands of VCO 10 in FIG. 1. Similarly, by way of example, switched capacitor circuit 94 may include a diode 98. The anode terminal of diode 98 may be coupled to a terminal of capacitor 56. The anode terminal of diode 98 may further be coupled to a terminal of inductive element 62. The cathode terminal of diode 98 may be coupled to voltage supply terminal VSS. In one embodiment, the application of the switching voltage may determine whether diode 98 is substantially conducting or substantially non-conducting. When the switching voltage is approximately zero, diode 98 may be substantially non-conducting. Inductive element 62 may be implemented using a transmission line. The length and/or width of the transmission line used to implement inductive element 60 may be selected such that inductive element 60 resonates at a certain frequency when diode 98 is substantially non-conducting.

In operation, to address process, voltage, and/or temperature variations, switching voltage control signal may be received from a device that can be used to detect (alone or in combination with other sensors/devices) any changes in process, voltage, and/or temperature. The switching voltage control signal may be supplied to switched capacitor circuits 22 and 24. This way, the variation in the frequency generated by differential VCO 10 may be adjusted to be closer to the default range of differential VCO 10. Similarly, to provide frequencies in a different band, switching voltage control signal may be generated to provide a control signal to switching voltage source 44.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

It is to be understood that the circuits depicted herein are merely exemplary. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A switched capacitor circuit for use at at least one operating frequency, the switched capacitor circuit comprising:
   an inductive element having a first terminal and a second terminal, wherein the first terminal is coupled to receive a switching voltage;
   a hetero-junction bipolar transistor (HBT) having a base terminal, a first conducting terminal, and a second conducting terminal, wherein the base terminal of the HBT is coupled to the second terminal of the inductive element, and wherein the second conducting terminal of the HBT is coupled to a voltage supply terminal; and
   a capacitor having a first terminal and a second terminal, wherein the first terminal of the capacitor is coupled to the first conducting terminal of the HBT and the second terminal of the capacitor is coupled to a node, wherein a capacitance value at the node is a function of the switching voltage,
   the inductive element is configured such that a combined impedance of an impedance of the capacitor, an impedance of the HBT, and an impedance of inductive element resonates at the at least one operating frequency only when the HBT is substantially non-conducting, and
   the node is coupled to a variable capacitor such that the variable capacitor is in parallel to the capacitor.

2. The switched capacitor circuit of claim 1, wherein when the HBT is substantially conducting, the capacitance value at the node is substantially equal to the sum of capacitance of the capacitor and capacitance of the variable capacitor.

3. The switched capacitor circuit of claim 1, wherein when the HBT is substantially non-conducting, the capacitance value at the node is substantially equal to capacitance of the variable capacitor.

4. The switched capacitor circuit of claim 1, wherein the switched capacitor circuit is for use with a voltage controlled oscillator (VCO), and wherein the switching voltage has a first magnitude corresponding to a first range of frequencies of the VCO, wherein the switching voltage has a second magnitude corresponding to a second range of frequencies of the VCO, and wherein the first range of frequencies is different from the second range of frequencies.

5. The switched capacitor circuit of claim 1, wherein the switched capacitor circuit is for use with a voltage controlled oscillator (VCO), and wherein the switching voltage is adjustable based on detecting a change in any one of process, voltage, or temperature associated with the functional circuit.

6. The switched capacitor circuit of claim 1, wherein the first conducting terminal of the HBT is an emitter terminal of the HBT and the second conducting terminal of the HBT is a collector terminal of the HBT.

7. A differential voltage controlled oscillator (VCO) for providing at least one operating frequency, the differential VCO comprising:
   a first switched capacitor circuit, comprising:
      a first inductive element having a first terminal and a second terminal, wherein the first terminal is coupled to receive a switching voltage,
      a first hetero-junction bipolar transistor (HBT) having a base terminal, a first conducting terminal, and a second conducting terminal, wherein the base terminal of the first HBT is coupled to the second terminal of the first inductive element, and wherein the second conducting terminal of the first HBT is coupled to a voltage supply terminal, and
      a first capacitor having a first terminal and a second terminal, wherein the first terminal of the first capacitor is coupled to the first conducting terminal of the first HBT and the second terminal of the first capacitor is coupled to a first node, wherein a capacitance value at the first node is a function of the switching voltage, and wherein the first inductive element is configured such that a combined impedance of an impedance of the first capacitor, an impedance of the first HBT, and an impedance of the first inductive element resonates at the at least one operating frequency only when the first HBT is substantially non-conducting, wherein the first node is coupled to a first variable capacitor such that the first variable capacitor is in parallel to the first capacitor; and
   a second switched capacitor circuit, comprising:
      a second inductive element having a first terminal and a second terminal, wherein the first terminal is coupled to receive the switching voltage,
      a second hetero-junction bipolar transistor (HBT) having a base terminal, a first conducting terminal, and a second conducting terminal, wherein the base terminal of the second HBT is coupled to the second terminal of the second inductive element, and wherein the second conducting terminal of the second HBT is coupled to the voltage supply terminal, and a second capacitor having a first terminal and a second terminal, wherein the first terminal of the second capacitor is coupled to the first conducting terminal of the second HBT and the second terminal of the second capacitor is coupled to a second node, and wherein the second inductive element is configured such that a combined impedance of an impedance of the second capacitor, an impedance of the second HBT, and an impedance of the second inductive element resonates at the at least one operating frequency only when the second HBT is substantially non-conducting, wherein the second node is coupled to a second variable capacitor such that the second variable capacitor is in parallel to the second capacitor.

8. The differential VCO of claim 7, wherein when each of the first HBT and the second HBT is substantially conductive: (1) the capacitance value at the first node is substantially equal to the sum of a capacitance value of the first capacitor and a capacitance of value the first variable capacitor, and (2) the capacitance value at the second node is substantially equal to the sum of a capacitance value of the second capacitor and a capacitance value of the second variable capacitor.

9. The differential VCO of claim 7, wherein when each of the first HBT and the second HBT is substantially non-conducting: (1) the capacitance value at the first node is substantially equal to a capacitance value of the first variable capacitor, and (2) the capacitance value at the second node is substantially equal to a capacitance value of the second variable capacitor.

10. The differential VCO of claim 7, wherein the switching voltage has a first magnitude corresponding to a first range of frequencies of the differential VCO, wherein the switching voltage has a second magnitude corresponding to a second range of frequencies of the differential VCO, and wherein the first range of frequencies is different from the second range of frequencies.

11. The differential VCO of claim 7, wherein the switching voltage is adjustable based on detecting a change in any one of process, voltage, or temperature associated with the differential VCO.

12. The differential VCO of claim 7, wherein the first conducting terminal of the first HBT is an emitter terminal of the first HBT and the second conducting terminal of the first HBT is a collector terminal of the first HBT, and wherein the first conducting terminal of the second HBT is an emitter terminal of the second HBT and the second conducting terminal of the second HBT is a collector terminal of the second HBT.

13. The differential VCO of claim 7, wherein the first inductive element comprises a first transmission line, and wherein the second inductive element comprises a second transmission line.

* * * * *